United States Patent [19]

Chui

[11] Patent Number: 5,757,056
[45] Date of Patent: May 26, 1998

[54] MULTIPLE MAGNETIC TUNNEL STRUCTURES

[75] Inventor: Siu-Tat Chui, Newark, Del.

[73] Assignee: University of Delaware, Newark, Del.

[21] Appl. No.: 745,815

[22] Filed: Nov. 12, 1996

[51] Int. Cl.$^6$ ............................ H01L 29/82; H01L 43/00
[52] U.S. Cl. ........................ 257/421; 257/108; 257/295; 324/249; 324/260; 324/263; 365/32; 365/65; 365/66
[58] Field of Search ................... 257/108, 295, 257/421, 424; 365/32, 48, 50, 55, 65–70, 74; 324/249, 260, 263

[56] References Cited

U.S. PATENT DOCUMENTS

| | | | |
|---|---|---|---|
| 4,471,467 | 9/1984 | De Jonge et al. | 365/8 |
| 5,218,512 | 6/1993 | Nakamura | 361/321 |
| 5,390,142 | 2/1995 | Gendlin | 365/145 |
| 5,432,373 | 7/1995 | Johnson . | |
| 5,477,482 | 12/1995 | Prinz | 365/129 |
| 5,565,695 | 10/1996 | Johnson | 257/295 |
| 5,629,549 | 5/1997 | Johnson | 257/421 |
| 5,629,922 | 5/1997 | Moodera et al. | 369/126 |
| 5,638,252 | 6/1997 | Drab et al. | 361/321.1 |
| 5,640,343 | 6/1997 | Gallagher et al. | 365/171 |
| 5,650,958 | 7/1997 | Gallagher et al. | 365/173 |

OTHER PUBLICATIONS

"Large Magnetoresistance at Room Temperature in Ferromagnetic Thin Film Tunnel Junctions", *Physical Review Letters*, vol. 74, No. 16, pp. 3273–3276 (Apr. 17, 1995).

L. Kladanoff and G. Bayin, *Quantum Statistical Mechanics*, Chapter 7, Benjamin, N.Y. (1962).

*Primary Examiner*—Mahshid D. Saadat
*Assistant Examiner*—Allan R. Wilson
*Attorney, Agent, or Firm*—Connolly & Hutz

[57] ABSTRACT

A double tunnel junction is disclosed that can be used as a magnetic sensor or as random access memories. The preferred embodiment comprises three magnetic metal materials separated by two insulating layers. A current is passed through the first tunnel junction thereby developing a voltage in the second junction. The resistance of this device can be changed over a 100% when an external magnetic field of just a few gauss is applied.

7 Claims, 1 Drawing Sheet

5,757,056

MULTIPLE MAGNETIC TUNNEL STRUCTURES

GOVERNMENT LICENSE RIGHTS

The U.S. Government has a paid-up license in this invention and the right in limited circumstances to require the patent owner to license others on reasonable terms as provided for by the terms of N00014-94-1-0213 awarded by Office of Naval Research.

BACKGROUND OF THE INVENTION

The subject of this invention is a magnetoresistive sensor having a unique combination of elements. This combination of elements results in a substantial change in resistance when even a minimal external magnetic field is applied. The preferred embodiment described below comprises a double tunnel junction, i.e., three magnetic metal sections separated by two insulators with a thickness in the order of 10 angstroms or two ferromagnets and one paramagnetic material separated by insulators. Application of even a minimum magnetic field to the double tunnel junction can effectuate a change in resistance from as much as 100 ohm by more than 100%.

One application of this double tunnel junction is as read heads in hard disks. Applicant's double tunnel junction provides orders of magnitude change in resistance for a given change in magnetic field, relative to existing devices.

One example of a prior art magnetoresistive device is that described in Johnson U.S. Pat. No. 5,432,373. The basic trilayer structure of the Johnson patent comprises two electrically conductive ferromagnetic layers separated by a thin conductive paramagnetic layer. The Johnson patent discloses gold as the preferred material for the paramagnetic layer. This patent theorizes that a current pumped between the ferromagnetic layers will force spin up and spin down electrons into the paramagnetic layer to slightly magnetize it. Johnson theorizes that his devices can be used as a current switch, memory cell or a magnetic field detector.

Another magnetoresistive device disclosed in the art is that described by Moodera et al in an article entitled "Large Magnetoresistance at Room Temperature in Ferromagnetic Thin Film Tunnel Junctions" which appeared in Volume 74, No. 16 of *Physical Review Letters*, pp. 3273-3276 (17 April 1995). In this article the author reports maximum change of about 25% in resistance ($\Delta R/R$) upon application of a magnetic field utilizing the Moodera et al structure. That structure is a sandwich of a thin layer insulation between ferromagnetic materials. As reported in the Moodera article this change in resistance sharply declines as applied voltage increases.

SUMMARY OF THE INVENTION

Applicant has discovered that the change in resistance ($\Delta R/R$) desired in a tunnel junction can be substantially improved by utilizing a double tunnel junction comprising alternating ferromagnetic materials and insulating materials. In contrast to the Moodera tunnel junction just described, applicant has found that his double tunnel junction results in a much greater change in resistance with minimal change in magnetic field. Also, that change is accomplished without the severe decline in resistivity experienced by Moodera as applied voltage increases.

Applicant's double tunnel junction 10 comprises two thin film insulating layers 12 and 14 sandwiched between three materials 16, 18 and 20. The first tunnel junction can comprise a first ferromagnetic material 16, a first insulator 12 and a second ferromagnetic material 18. The second tunnel junction can comprise ferromagnetic material 18, second insulator 14 and a ferromagnetic material 20. The second material 18 can be replaced by paramagnetic material, however, the first and third materials cannot.

In operation a current I$\alpha$ is passed through the first tunnel junction 16, 12, 18 with current going into the first ferromagnetic material 16 and coming out of the second ferromagnetic material 18. Voltage is measure across the second tunnel junction 18, 14, 20 with leads attached to the second 18 and third 20 materials. The measured voltage divided by the current is the effective resistance R. This resistance is different from ordinary resistance where the voltage and current are measured across the same tunnel junction.

DETAILED DESCRIPTION OF THE PREFERRED EMBODIMENTS

Figure 1:
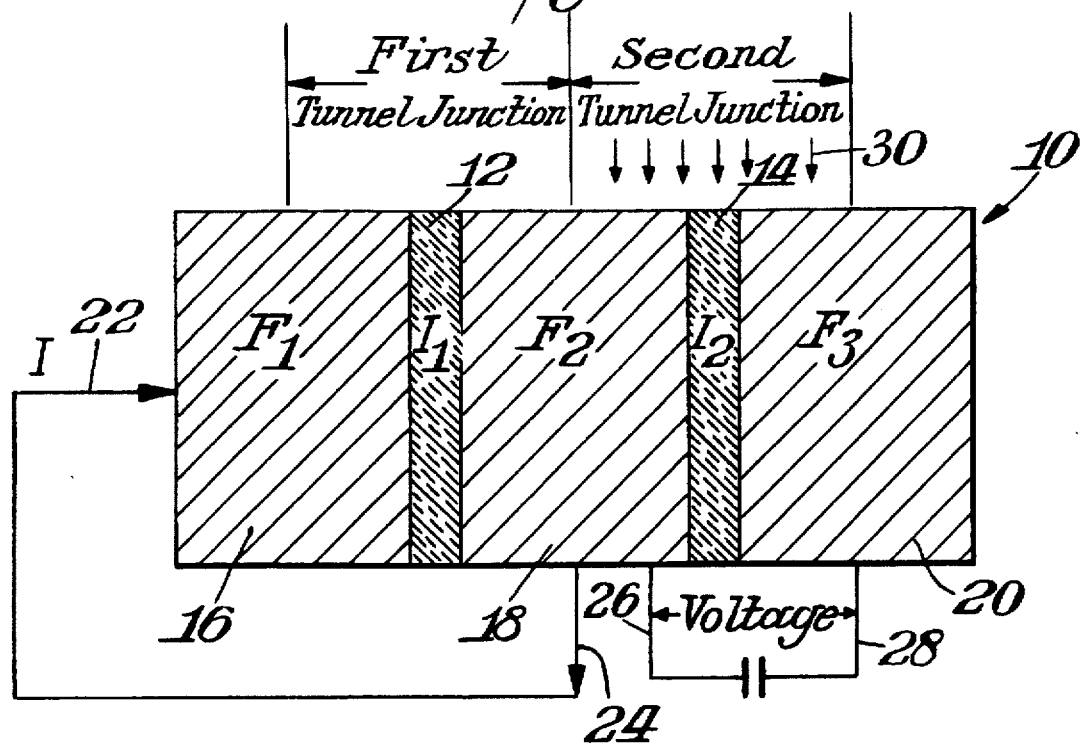
FIG. 1 is a cross-sectional view of the five component double tunnel junction of the invention.

The overall structure of the double tunnel junction of this invention is illustrated in FIG. 1. Its preferred composition is as previously described, i.e., alternating layers of ferromagnetic material 16, 18, 20 and insulating material 12, 14. The ferromagnetic material suitable for use in this invention includes: iron, Permadur (an alloy of 49% iron, 49% cobalt and 2% vanadium), Permalloy (an alloy of iron and nickel), cobalt, nickel and manganese (or alloys of these three components). The insulating material suitable for use in this invention includes aluminum oxide ($Al_2O_3$) and magnesium oxide (MgO). Typically the overall dimensions of each layer of material fall within the range of $10^{-1}$ to $10^{-4}$ square millimeters or smaller and have a thickness of about 1 to 10 nanometers. Suitable leads 22, 24 are attached to the first tunnel junction for imposing current therethrough. Similar leads 26, 28 are attached to the second tunnel junction. Voltage across leads 26, 28 is subsequently measured.

Figure 2:
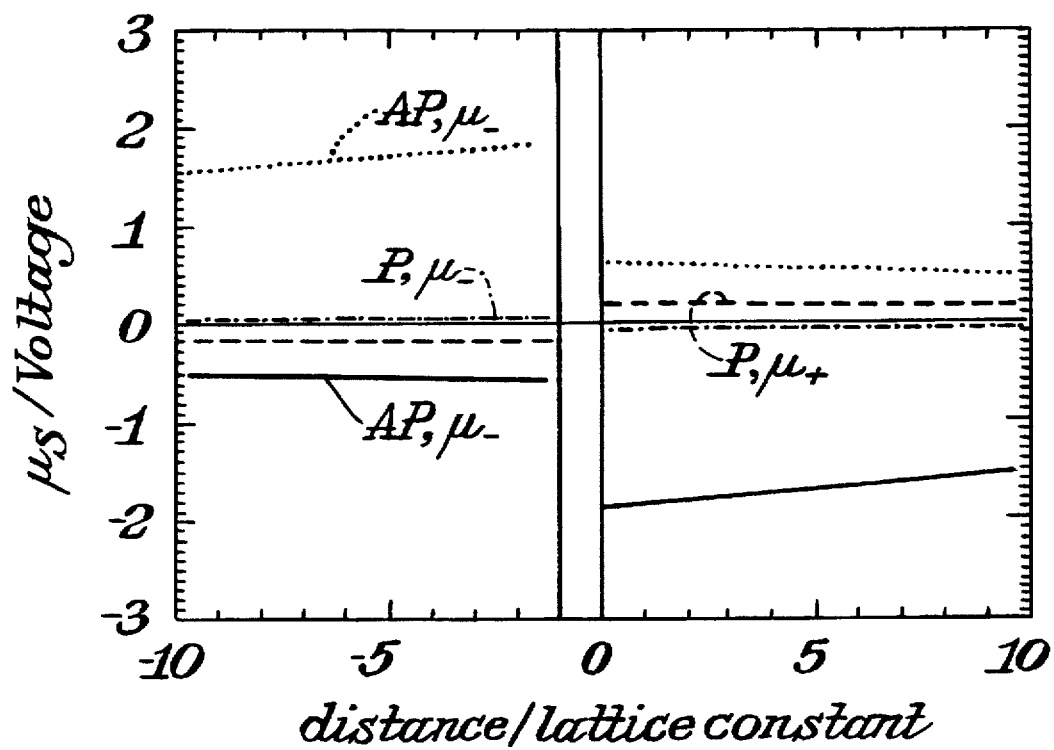
FIG. 2 is a schematic diagram of the chemical potentials of the spin up and spin down bands in a tunnel junction.

The underlying operation of the double tunnel junction is as follows. A ferromagnetic material contains within it electrons with their spin (the magnetic moment is proportional to the spin) up and electrons with their spin down. For a given tunnel junction, when a current is passed through it, the chemical potentials of the spin up and the spin down electrons become different. This difference is called the splitting and is proportional to the magnitude of the external current (FIG. 2). The ratio of this splitting to the current is of the order of the resistance of the tunnel junction. The mathematical analysis is "reversible" in that when there is a splitting in the chemical potentials, a current (for closed circuits) or a voltage (for open circuits) will be induced. When a current is passed through the first tunnel junction, there is a splitting of the chemical potential in the second material 18. The reverse is true of the second tunnel junction. Because of the "splitting" in the second material 18 which is part of the second tunnel junction 18, 14, 20, a current or a voltage is induced in the second tunnel junction.

The direction of the current depends on the direction of the magnetization of the second or third materials 18 or 20, provided certain conditions are met. If the direction of the magnetization of these materials 18 or 20 is reversed, which can be caused by an external magnetic field, 30 the sign of the current or voltage in the second tunnel structure is reversed. Thus, the application of a small external magnetic field can result in a substantial change in the resistance of this device.

The condition can be stated in precise mathematical terms and roughly corresponds to the requirement that the spin asymmetry is stronger in the third material 20 than in the second material 18. This analysis is performed by solving a so-called linearized Landau-Vlasov-Boltzman equation which describes the transport of the electrons inside the ferromagnets, taking into account the Coulomb interaction between the electrons. This equation is described in L. Kadanoff and G. Bayin, "Quantum Statistical. Mechanics", Chapter 7, Benjamin, N.Y. (1962). The solutions are then matched across each of the insulating materials 12, 14.

To better understand the operation of this invention a brief explanation is provided of the mechanics by which a current in a tunnel structure can induce a splitting of the chemical potentials of the spin up and the spin down electrons. Each of the tunnel junctions can be viewed as having a total thickness L comprising a trilayer structure of two coupled ferromagnets on the left and on the right and an insulator in between. We assume the z direction to be perpendicular to the insulating interface which is located from $z=-d/2$ to $d/2$. There is an interfacial resistance of magnitude $r(1-\gamma s)$ for spin channel $s=\pm 1$ caused by the insulating barrier between the ferromagnets. Thus r is the average resistance of the spin up and the spin down channel. $2\gamma r$ is the difference between these two channels. We assume that the thickness of our device is less than the spin diffusion length (of the order of 100 A) so that we can ignore the conversion of the spin up electrons into spin down electrons or vice versa.

r is of the order of kilo—ohms and is much larger than the resistance of the ferromagnets $r_F$. The chemical potential for spin s on the left and right is represented by $\mu_s^<$ and $\mu_s^>$, respectively, and the current carried by electrons of spin s by the symbol $J_s$. Superscripts <, > denote the left and right side of the junction. Because of the high interfacial resistance $r(1-\gamma s)$, most of voltage drop will occur at the interface. We obtain, from Ohm's law, $$\Delta\mu_s = \mu_s^>(z=d/2) - \mu_s^<(z=-d/2) = r(1-\gamma s)J_s. \quad (1)$$

We explain why $\mu_+ \neq \mu_-$ below.

Associated with the change of the chemical potential, there is a change of the electron density of spin s by an amount given by $\delta\rho_s = \mu_s N_s$ where $N_s$ is the density of states at the Fermi surface for electrons of spin $s=\pm 1$. This change in turn implies changes in the net charge ($\rho$) and magnetization ($\sigma$) densities given by $\delta\rho^< = \delta\rho_+^< + \delta\rho_-^< = N_+^< \mu_+^< + N_-^< \mu_-^<$, $\delta\sigma^< = \delta\rho_+^< - \delta\rho_-^< = N_+^< \mu_+^<$ with similar expressions for the right hand side of the junction where the superscript< is replaced by>. These induced charge and spin densities are due to shifts in the chemical potential and not to spin accumulation. Spin accumulation can also cause a splitting of the chemical potential (see column 4 of Johnson U.S. Pat. No. 5,432,373). For spin accumulation, an additional magnetization $\delta\sigma'$ of the order of $I_m T_2/\Omega$ is created on the right hand side (of volume $\Omega$) due to the injection magnetization current $I_m$ from the left hand side which takes a finite time $T_2$ to relax. This $\delta\sigma'$ is also present in addition to the $\delta\sigma$ discussed above but is of a much smaller magnitude. The physics of this structure requires that the net charge induced becomes very small, of the order of $r_F/r$ times $N_s\mu_s$. This implies that the shifts in the chemical potentials are opposite in sign. More precisely, $\delta\rho=0.5\Sigma_s\delta\rho_s=0.5\Sigma_s\mu_s N_s \approx 0$. Thus, $\mu_- \approx -N_- \mu_-/N_+$. We now turn our attention to why the net charge induced at the interface is small.

For an external electric field E, the current can be expressed as a sum of a term $E/\rho_{sF}$ due to the external driving field in the metal and another term $J_{sl}$ due to the potential caused by the difference between the induced charge densities and that due to the self consistent screening potential W caused by the Coulomb repulsion between electrons:

$$J_s = J_{sl} + E/\rho_{sF} \quad (2)$$

$J_{sl} \propto -\Sigma_p t_s \partial_s [\delta\rho_s/m_s - x_s W]/m_s$. Here $\rho_s F$, the resistivity of the ferromagent is given by $\rho_{sF}^{-1} = -\Sigma_p t_s X_0/2m_s^2$, $x_0 = (\Sigma_s t_s \partial_e f_{0s}(e)/m_s^2)/(\Sigma_s t_s/2m_s^2)$ is a density of states factor $f_{0s}$ is the Fermi distribution function; $t_s$, $m_s$ are the relaxation time in the ferromagnet and the effective mass. $X_s = \partial_e f_{0s}/m_s$. Recall that the charge density of spin s is a sum of the total charge and magnetization densities $\delta\rho_s = (\rho + s\sigma)/2$. Away from the interface, the magnetization decays at a rate proportional to the renormalized spin diffusion length l (of the order of 100 Å) whereas the charge density decays at a faster rate proportional to the screening length $\lambda$ (of the order of a few Å). Since the charge density dies off much faster than the magnetization density, the rate of change of $\delta\rho_s$ is approximately equal to $0.5 \rho/\lambda$. $J_{sl}$ is thus of the order of magnitude $\delta\rho t_s/m_s^2\lambda \approx \delta\rho/(x_0\rho_{sF}\lambda)$, on using the definition of the resistivity $\rho_{sF}$.

There are two resistances that enter into consideration: the interfacial resistance r and that of the ferromagnets $r_F = \rho_F l/\alpha$. For problems of practical interest, for an area $\alpha$ of $10^{-4}$cm$^2$, r is of the order of k-ohm whereas $\rho_F l/\alpha$ is of the order of $10^{-5}$ ohm. Thus $r \gg \rho_F l/\alpha \gg \rho_F \lambda/\alpha$. We expect that unless there is a cancellation, $\delta\rho_s$ and hence $\delta\rho$ is of the order of $N_s\mu_s \propto N_s r J_s$. Substituting this estimate of $\delta\rho$ into the estimate of $J_{sl}$ in the previous paragraph, we found that $J_{sl}$ is of the order of $rJ_s\alpha/\rho_F\lambda$ and is much larger than the current due to the external field. Because of the rapid decay of the charge densities, an electric field is created that may become much larger than the external field. This cannot be self-consistently sustained and equation (1) cannot be satisfied unless the change in the charge densities of each spin component are such that the net charge density $\delta\rho=0$.

In summary, the net charge induced is smaller than expected. This implies a splitting of the chemical potential of the spin up and the spin down electrons right at the interface.

The following argument provides a picture of why the voltage may reverse sign as the magnetization of ferromagnet 20 is reversed. Consider the extreme case that the spin asymmetry in the third ferromagnetic material 20 is such that only a single spin species occurs with energies at the Fermi energy. Assume that the chemical potential is split in the second material 18 with the spin up energy above the spin down energy. We expect the chemical potential of the single spin component in the third material 20 to be between the chemical potentials in the second material 18. If the third material 20 spin component is down, then the electrons will flow from the third material 20 to the second material 18 where the chemical potential of the spin down electron is lower than that in third material 20. If we switch the magnetization of the third material 20 so that the spin component in that component is now spin up, electrons will flow from second to third material because the chemical potential of the spin up electrons in the second material 18 is now higher. A similar argument also works if we switch the magnetization of the second material 18 while that of third ferromagnetic material 20 is fixed.

A detailed analysis provides the following result for the magnetization $M_2$ in the second ferromagnet.

$$M_2/\text{current} \propto [(B-\gamma)/N_D{}^>-(1-\gamma B)/N_S{}^>]4\tau[1/N_{SA}N_{DS}-1/N_{DA}N_{SS}](3)$$

where $1/N_D=1/N_+-1/N_-, 1/N_S=1/N_-, 1 /N_{XA}=1/N_x{}^>-1/N_x{}^<-1/N_x{}^<, 1/ N_{XS}=1/N_x{}^>+1/N_x{}^>$; X=D or S. $B=(b^>G^<+B^<G^>)/(G^<-G^>)$; $G=-0.5(b+\beta)/[\lambda_{\rho F}{}^2(1-\beta^2)]$ where we have assumed that the resistivity of the ferromagnet for spin channel s, $\rho_{sF}$, can be written as $\rho_F(1-s\beta)$. b is a parameter that measures the difference in transport properties between the spin up and the spin down electrons given by $b=(\Sigma_s t_s x_s S/m_s)/(\Sigma_s t_s x_s/m_s)$. The parameter $\beta$ for the asymmetry of the resistivity can be written in a similar fashion as $\beta=-\Sigma_s St_s/2m_s{}^2/\Sigma_s t_s/2m_s{}^2$.

For a fixed magnetization $M_2$ in the second ferromagnetic (paramagnetic) material 18 that is created by the current through leads 22–24, as the magnetization of 20 is reversed, $N_D$, B and $\gamma$ changes sign. Thus, any possible sign changes will be determined by $N_{DA}$ and $N_{DS}$. If the two sides are identical, then for the P (AP) case, quantities with subscripts A (S) are zero. We get $\tilde{A}=0$ ($\Delta A=0$), no sign change occurs On the other band, if there is a band with a low density of states on the > side such that $|1/N^>{}_D|>|1/N_D{}^<|$, then the voltage will change sign when the > magnetization is changed.

The tunnel junction device of this invention can be used as a magnetic sensor or as a non-volatile random access memory (RAM).

Magnetic sensors are used in different applications. Examples are as read heads in hard disks, as sensors in different parts of the automobile, or in traffic controls. The external field comes from the magnetic media (on disk) in a recording situation. Or it can come from magnets embedded in an mechanical instrument. In all these applications, the external magnetic field is expected to possess a component aligned along the planes of the double tunnel junction structure. When the external field is big enough, the magnetization of one of the ferromagnetic materials can be changed. With the appropriate choice of ferromagnetic material, such as Permalloy, in applicant's device, fields as low as a few Gauss can be easily detected.

Depending on the application there are different design possibilities. One can "pin" the magnetization of some of the three ferromagnetic components so that one or two, for example, the first and second materials, do not rotate under a field of reasonable strength that is encountered in an application. This "pinning" can be achieved by using a material of high coercivity such as cobalt or iron or by placing a material of high coercivity in contact with the ferromagnetic layers. For applications as the read head in hard disks we expect the layers to be parallel to the platters of the media. For longitudinal media where the magnetization is mostly along the platter, we expect the stray field on top of the media to cause the switching.

For application as rams, the magnetization states of the three ferromagnets store the information. In principle, the structure can store more than a single bit because there are 8 possible combinations for the direction of the magnetization of the three materials 16, 18, 20 in the double barrier junction. For the simplest example, we assume that two of the three materials are pinned so that only one (for example, the third) can be reversed. In a typical application, we expect an array of these junctions to be created by, for example, lithographic techniques. The direction of the magnetization can be switched ("written") by an external field along the planes of the junction generated by a current in an external wire. This information can be read by applying a current to the first tunnel junction 16, 12, 18 and then checking the sign of the voltage across the second junction 18, 14, 20.

I claim:

1. A double tunnel junction comprising:

a first ferromagnetic layer;

a first insulating layer disposed on the first ferromagnetic layer;

a second layer consisting of a ferromagnetic or paramagnetic material disposed on the first insulating layer and aligned with the first ferromagnetic layer;

a second insulating layer disposed on the second layer;

a third ferromagnetic layer disposed on the second insulating layer and aligned with the second layer; and means for passing a biasing current from the first ferromagnetic layer to the second layer, wherein a resultant voltage across the second layer and the third ferromagnetic layer is measured.

2. The double tunnel junction of claim 1, wherein an external magnetic field is imposed on the second layer and the third ferromagnetic layer.

3. The double tunnel junction of claim 2, wherein a change in the external magnetic field causes a change in the resistance across the double tunnel junction.

4. The double tunnel junction of claim 3, wherein a change of 100 oersted (Oe) in the magnetic field results in a 100% change in resistance across the double tunnel junction.

5. The double tunnel junction of claim 1, wherein the ferromagnetic material is iron, Permadur, Permalloy, cobalt, nickel or manganese.

6. The double tunnel junction of claim 1, wherein the first and second insulating layers comprise aluminum oxide and magnesium oxide.

7. The double tunnel junction of claim 1, wherein the first and second insulating layers, the first and third ferromagnetic layers, and the second layer each have a thickness of 1 to 10 nanometers.

* * * * *